(12) United States Patent
Tanahashi et al.

(10) Patent No.: US 9,557,029 B2
(45) Date of Patent: Jan. 31, 2017

(54) LIGHTING DEVICE

(71) Applicant: Panasonic Corporation, Osaka (JP)

(72) Inventors: Osamu Tanahashi, Kyoto (JP);
Yoshiyuki Miyake, Osaka (JP);
Tadashi Murakami, Osaka (JP);
Hideharu Kawachi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/185,049

(22) Filed: Feb. 20, 2014

(65) Prior Publication Data

US 2014/0247600 A1 Sep. 4, 2014

(30) Foreign Application Priority Data

Mar. 1, 2013 (JP) .................. 2013-041164

(51) Int. Cl.
*F21V 7/00* (2006.01)
*F21V 13/02* (2006.01)
(Continued)

(52) U.S. Cl.
CPC .................. *F21V 7/00* (2013.01); *F21V 13/02* (2013.01); *H01L 51/524* (2013.01); *H01L 51/5271* (2013.01); *F21S 8/033* (2013.01); *F21S 8/04* (2013.01); *F21Y 2105/00* (2013.01); *F21Y 2115/15* (2016.08); *H01L 51/5268* (2013.01); *H01L 2251/5361* (2013.01)

(58) Field of Classification Search
CPC ............. H01L 51/5279; H01L 51/5271; H01L 51/524; F21V 7/00; F21V 13/02
See application file for complete search history.

(56) References Cited

U.S. PATENT DOCUMENTS

| 2005/0253492 A1 | 11/2005 | Besshi et al. |
| 2010/0328943 A1 | 12/2010 | Takamura et al. |
| 2012/0199869 A1 | 8/2012 | Tsurume |

FOREIGN PATENT DOCUMENTS

| EP | 2473002 A2 | 7/2012 |
| EP | 1596638 A1 | 11/2012 |

(Continued)

OTHER PUBLICATIONS

European Search report for corresponding Application No. 14156442.7-1555, dated Apr. 6, 2014.

(Continued)

*Primary Examiner* — Mary Ellen Bowman
(74) *Attorney, Agent, or Firm* — Renner, Otto, Boisselle & Sklar, LLP

(57) ABSTRACT

A lighting device 1 includes a planar light-emitting panel 4 and a translucent material 5 disposed on a light-emitting surface side of the planar light-emitting panel 4. The planar light-emitting panel 4 has a light-emitting region 4A and a non-light-emitting region 4B. The translucent material 5 has a reflection part 51 in a region facing the non-light-emitting region 4B. Light emitted from the planar light-emitting panel 4 and guided into the translucent material 5 is reflected by the reflection part 51 and emitted to the front side of the non-light-emitting region 4B. Accordingly, the front side of the non-light-emitting region 4B does not become a dark section, so that it is capable of increasing the light irradiation region and giving the light irradiation surface having uniform illuminance even if the plural lighting devices 1 are arranged in a matrix form.

8 Claims, 8 Drawing Sheets

(51) Int. Cl.
    *H01L 51/52*     (2006.01)
    *F21S 8/00*     (2006.01)
    *F21S 8/04*     (2006.01)
    *F21Y 105/00*     (2016.01)

(56) References Cited

FOREIGN PATENT DOCUMENTS

| | | |
|---|---|---|
| JP | 2005-332616 A | 12/2005 |
| JP | 2005-353560 A | 12/2005 |
| JP | 2006-228456 A | 8/2006 |
| JP | 2009-87830 A | 4/2009 |
| JP | 2011-108568 | 6/2011 |
| JP | 2011-243448 A | 12/2011 |
| WO | WO 2013/027508 A1 | 2/2013 |

OTHER PUBLICATIONS

English Translation of Chinese Search Report dated Nov. 20, 2015 for corresponding Chinese Application No. 201410069010.0.
Japanese Office Action dated Sep. 6, 2016 for corresponding Japanese Application No. 2013-041164.
Japanese Office Action dated Nov. 29, 2016 for corresponding Japanese Application No. 2013-041164.

LIGHTING DEVICE

BACKGROUND ART

Field of the Invention

The present invention relates to a lighting device which has an organic EL (electroluminescence) element as a light source.

Description of the Related Art

The organic EL element is capable of emitting light of high luminance at a low voltage, and various colors of the emitted light are obtained therefrom depending on types of organic compounds included in the organic EL element, and moreover, it is easy to manufacture the organic EL element as a planar light-emitting panel. As shown in FIG. 12, such a planar light-emitting panel 10 includes, for example, a base material 20, an organic EL element 30 provided in a center of the base material 20 and plural electrode pads 40 provided on the base material 20 so as to surround the organic EL element 30 (refer to Japanese Laid-Open Patent Publication No. 2012-182129, for example). Each of the electrode pads 40 is electrically connected to an anode layer or a cathode layer (neither of them is shown) of the organic EL element 30 and mediates a power feeding from an external power source to the anode layer or the cathode layer. In the planar light-emitting panel 10, a region corresponding to the organic EL element 30 is a light-emitting region 10A from which light is emitted and a region corresponding to the electrode pads 40 (shown by dots) surrounding the organic EL element 30 is a non-light-emitting region 10B from which the light is not emitted.

As shown in FIG. 13, the above planar light-emitting panel 10 can be utilized as a light source of a lighting device 50 which includes a housing 60 storing the planar light-emitting panel 10 and a translucent material 70 disposed on a light-emitting side of the planar light-emitting panel 10 (refer to Japanese Laid-Open Patent Publication No. 2011-108568, for example). The translucent material 70 and the base material 20 of the planar light-emitting panel 10 are adhered to each other with a translucent resin 80. Light emitted from the planar light-emitting panel 10 passes through the translucent resin 80 and the translucent material 70 and is emitted outside.

However, in the above lighting device 50, the front side of the light-emitting region 10A becomes a bright section emitting light of high luminance and the front side of the non-light-emitting region 10B becomes a dark section emitting light of low luminance, so that light irradiation region is small. Moreover, when the plural lighting devices 50 are arranged in a matrix form, the light irradiation surface does not become uniform where the bright section and the dark section are mixed, making the appearance of the lighting devices 50 awkward.

SUMMARY OF THE INVENTION

The present invention is to solve the problem described above and an object of the present invention is to provide a lighting device which can increase a light irradiation region and give a light irradiation surface having uniform illuminance.

According to one aspect of the present invention, since a reflection part is provided in the region of the translucent material facing the non-light-emitting region, the light which is emitted from the planar light-emitting panel and guided into the translucent material is reflected by the reflection part and then emitted to the front side of the non-light-emitting region. Therefore, the front side of the non-light-emitting region does not become a dark section, so that it is capable of increasing the light irradiation region and giving the light irradiation surface having uniform illuminance even if the plural lighting devices are arranged in a matrix form.

BRIEF DESCRIPTION OF THE DRAWINGS

The present invention will be described below with reference to the annexed drawings. It is to be noted that all the drawings are shown for the purpose of illustrating the technical concept of the present invention or embodiments thereof, wherein.

DETAILED DESCRIPTION OF THE INVENTION

Figure 1:
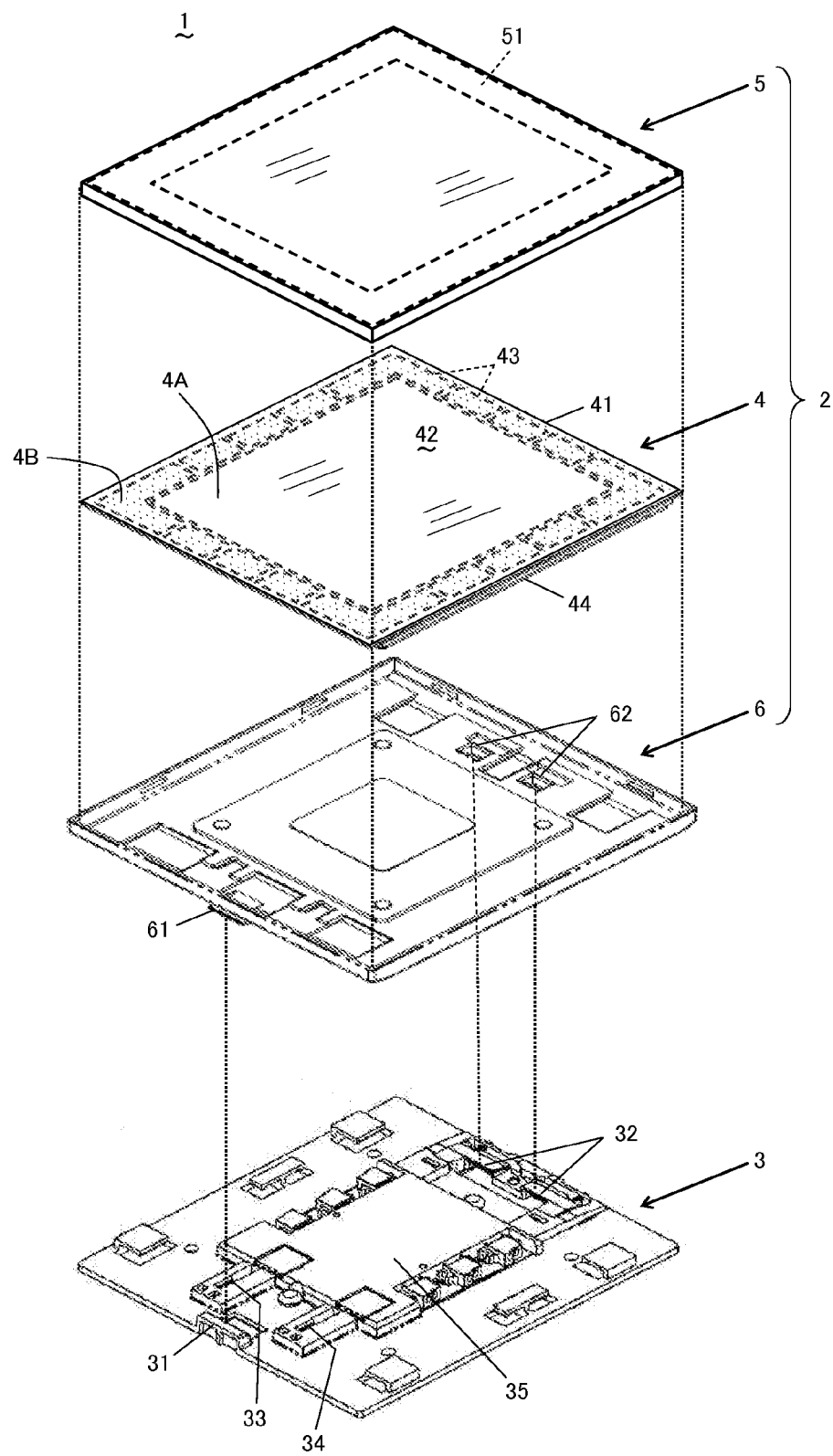
FIG. 1 is an exploded perspective view of a lighting device according to a first preferred embodiment of the present invention.
Figure 2A:
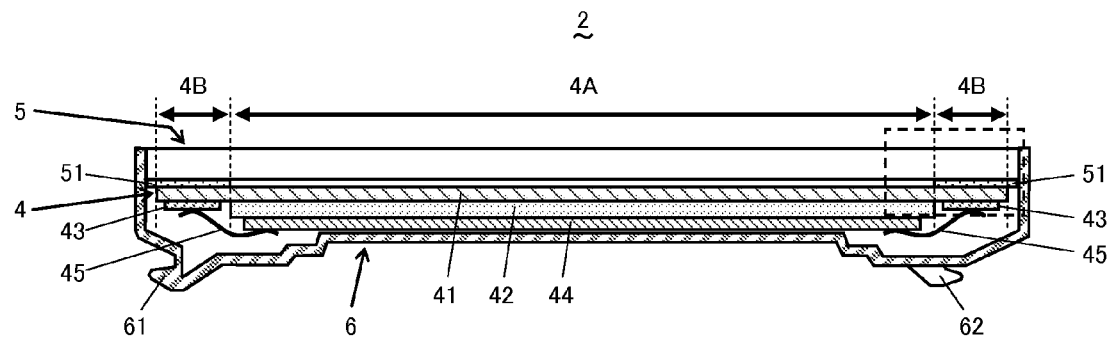
FIG. 2A is a cross-sectional view of a light source unit which makes up the lighting device shown in FIG. 1.

A lighting device according to a first preferred embodiment of the present invention is described with reference to FIGS. 1, 2A, and 2B. As shown in FIG. 1, a lighting device 1 includes a light source unit 2 and an attachment unit 3 to which the light source unit 2 is to be attached in a removable fashion.

The attachment unit 3 has a rectangular planar shape, and its one surface which faces the light source unit 2 is an attachment surface to which the light source unit 2 is to be attached and another surface is a mounting surface which is to be mounted on a construction surface such as a ceiling and a wall. The attachment unit 3 has a holding part 31 and an engagement part 32 which are utilized to engage the light source unit 2 on the attachment surface. In the illustration example, one holding part 31 is provided in a center of one side of the attachment surface and the two engagement parts 32 are provided in a center of the opposite side of the attachment surface. Moreover, the attachment unit 3 includes: one pair of terminal receiving parts 33, 34 into which one pair of power feeding terminals (not shown) provided in the light source unit 2 and used for power supply to the light source unit 2 is inserted; and a circuit board 35 which is electrically connected to the terminal receiving parts 33, 34 and controls the power supply from an external power source to the light source unit 2.

The light source unit 2 has a rectangular planar shape. One surface of the light source unit 2 which faces the attachment unit 3 is an attachment surface to which the attachment unit 3 is to be attached and another surface is a light-emitting surface. In the following description, the light-emitting surface side is referred to as an upper surface side and the attachment surface side is referred to as a lower surface side in accordance with FIG. 1. The light source unit 2 has a planar light-emitting panel 4 which has a light-emitting surface in an upper surface and a translucent material 5 disposed on the upper surface side (the light-emitting surface side) of the planar light-emitting panel 4 (also refer to FIG. 2A). These planar light-emitting panel 4 and the translucent material 5 are held by a backside case 6 from the lower surface side of the planar light-emitting panel 4 so that the upper surface of the translucent material 5 is exposed to the outside.

The planar light-emitting panel 4 has a base material 41 having a rectangular planar shape, a rectangular organic EL element 42 provided in a center of a lower surface of the base material 41, plural electrode pads 43 provided on the lower surface of the base material 41 so as to surround the organic EL element 42 and a wiring board 44 provided on the lower surface side of the organic EL element 42.

The base material 41 is made up of a translucent material such as a transparent glass plate. The organic EL element 42 has a general layer structure. In the illustration example (refer to FIG. 2B), the organic EL element 42 is configured by laminating, in order from the base material 41 side, an anode layer 42*a*, an organic layer 42*b* including an organic luminescent material and a cathode layer 42*c* having light reflectivity. Each of the anode layer 42*a* and the cathode layer 42*c* itself extends outside the organic layer 42*b* or is extended via an auxiliary electrode (not shown) and the electrode pads 43 are provided on the extended part of the anode layer 42*a* and the cathode layer 42*c*. Each of the electrode pads 43 is electrically connected to the wiring board 44 via conductive wire 45 (refer to FIG. 2A). The wiring board 44 has the pair of power feeding terminals (not shown) described above. Electrical power supplied from the circuit board 35 of the attachment unit 3 to the wiring board 44 via the power feeding terminals is supplied to the organic EL element 42 via the conductive wires 45 and the electrode pads 43. Since the electrode pads 43 are disposed around the organic EL element 42, the voltage applied to the organic EL element 42 becomes uniform, enabling the organic EL element 42 to emit the light with uniform luminance.

In the planar light-emitting panel 4 having the above configuration, a region where the organic EL element 42 is provided is a light-emitting region 4A from which the light is emitted. On the other hand, a region where the electrode pads 43 are provided (shown by dots in FIG. 1) is a non-light-emitting region 4B from which no light is emitted.

The translucent material 5 has a rectangular planar shape having substantially the same size with the base material 41 of the planar light-emitting panel 4 and is made up of a translucent material such as a transparent glass plate and a transparent acrylic resin plate. The translucent material 5 has a reflection part 51 which is provided in a region facing the non-light-emitting region 4B of the planar light-emitting panel 4 to reflect and diffuse the light. The reflection part 51 is formed, for example, by applying a white coating material or sticking a white tape on the edge of the lower surface of the translucent material 5. However, a configuration of the reflection part 51 is not limited to these and the reflection part 51 can be formed with any material which reflects and diffuses the light.

The backside case 6 has a box shape with an opening on its upper surface and stores the planar light-emitting panel 4 and the translucent material 5 inside. The backside case 6 has a supported part 61 to be engaged with the holding part 31 of the attachment unit 3 and an engaged part 62 to be engaged with the engagement part 32 of the attachment unit 3 at the outside of the lower surface.

Figure 2B:
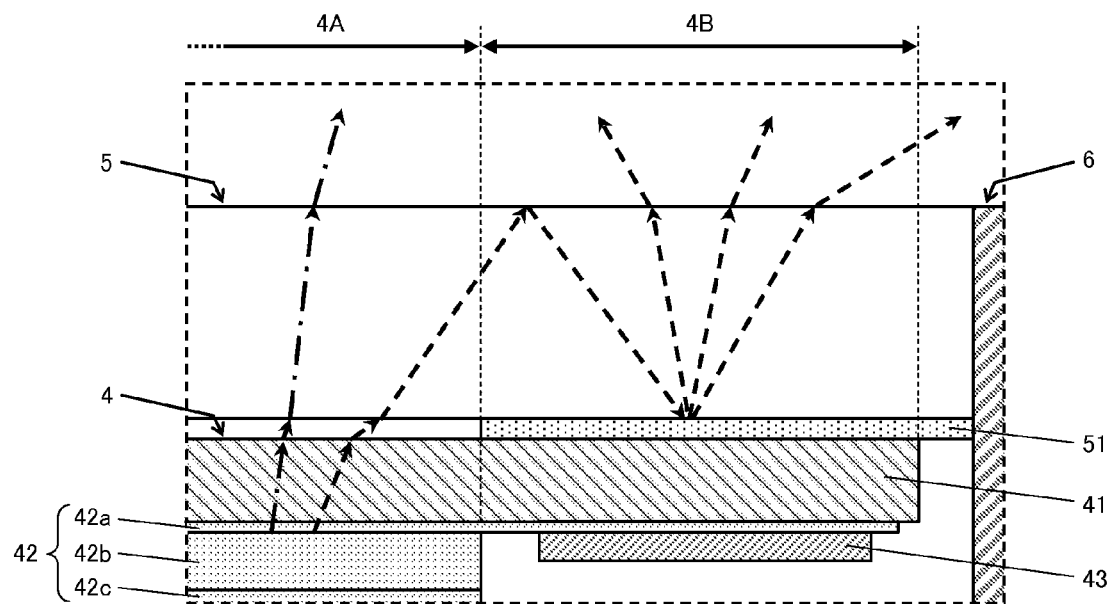
FIG. 2B is an enlarged view of a region enclosed by a dashed line in FIG. 2A.

As shown in FIG. 2B, in the lighting device 1 having such a configuration, much of the light emitted from the organic EL element 42 (shown by arrows of alternate long and short dash lines) passes through the base material 41 and the transparent material 5 and is emitted to a front side of the light-emitting region 4A. At this time, part of the light emitted from the organic EL element 42 (shown by arrows of dash lines) is guided into the translucent material 5 laterally and reaches the non-light-emitting region 4B and then reflected and diffused by the reflection part 51, resulting in the light emission to a front side of the non-light-emitting region 4B.

According to the lighting device 1 of the present preferred embodiment, since the reflection part 51 is provided in the region of the transparent material 5 facing the non-light-emitting region 4B, the light which is emitted from the planar light-emitting panel 4 and then guided into the transparent material 5 can be reflected by the reflection part 51 and emitted to the front side of the non-light-emitting region 4B. Therefore, the front side of the non-light-emitting region 4B does not become a dark section, so that it is capable of increasing the light irradiation region. Moreover, when the plural lighting devices 1 are arranged in a matrix form, the dark section which can be caused by the non-light-emitting region 4B does not appear at a boundary of the mutually adjacent lighting devices 1, thereby giving rise to the light irradiation surface having uniform illuminance as a whole.

Figure 3A:
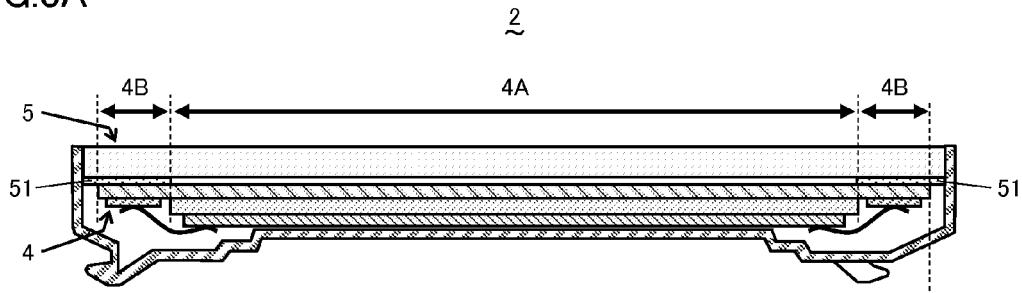
FIGS. 3A and 3B are cross-sectional views showing misalignment of a planar light-emitting panel relative to a translucent material in the light source unit shown in FIG. 2A.
Figure 3B:
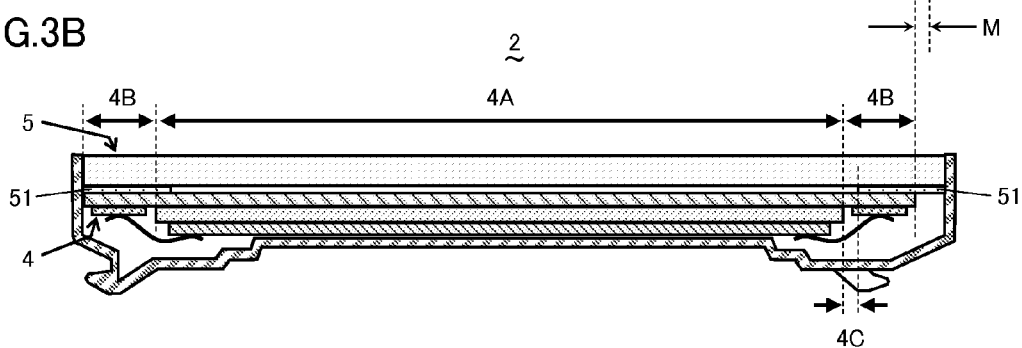

In view of workability of assembling the light source unit 2, the planar light-emitting panel 4 and the translucent material 5 are arranged apart from the backside case 6 by predetermined gaps. Accordingly, it is possible to occur a slight position gap (misalignment) between the planar light-emitting panel 4 and the translucent material 5. FIG. 3A shows the light source unit 2 in which the planar light-emitting panel 4 is properly positioned with relative to the translucent material 5. In contrast, FIG. 3B shows the light source unit 2 in which the planar light-emitting panel 4 is misaligned with relative to the translucent material 5. As shown in FIG. 3B, when the planar light-emitting panel 4 is misaligned (as indicated by "M") with relative to the translucent material 5, a non-light-emitting region 4C, which is part of the non-light-emitting region 4B, may not be covered by the reflection part 51 and directly face the translucent material 5. In such a case, the front side of the non-light-emitting region 4C becomes the strong dark section which results in an occurrence of a black line on the light irradiation surface of the lighting device 1, making an appearance of the lighting device 1 awkward.

Figure 4A:
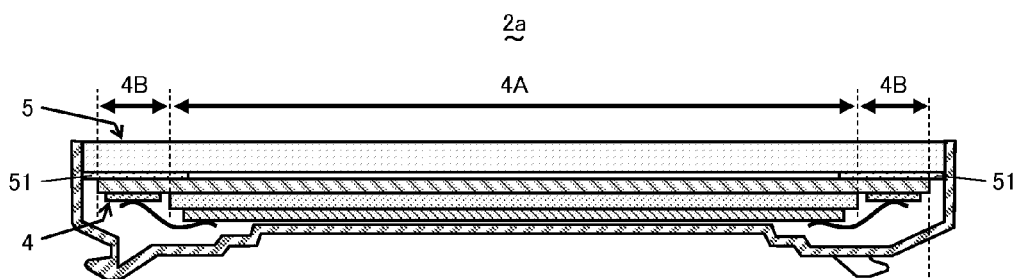
FIGS. 4A and 4B are cross-sectional views showing misalignment of a planar light-emitting panel relative to a translucent material in a light source unit according to more preferable embodiment of the first preferred embodiment.
Figure 4B:
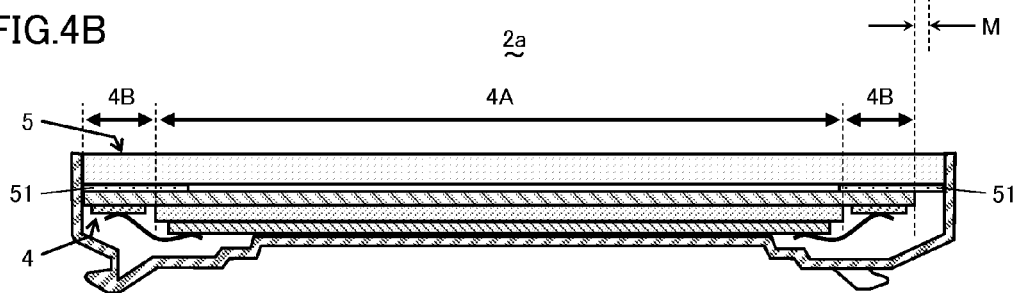

To overcome this problem, as shown in FIG. 4A, in a light source unit 2a which is more preferable embodiment of the above preferred embodiment, the reflection part 51 is extended toward a region facing the light-emitting region 4A of the planar light-emitting panel 4. According to such a configuration, as shown in FIG. 4B, even when the planar light-emitting panel 4 is misaligned (as indicated by "M") with the translucent material 5, the non-light-emitting region 4B is reliably covered by the reflection part 51 and thus the occurrence of the dark section can be prevented. In the illustration example, the reflection part 51 is extended widely toward the light-emitting region 4A side for easy understanding. However, since such a misalignment is actually slight, the reflection part 51 should be extended so that the region surrounded by the reflection part 51 becomes slightly smaller than the light-emitting region 4A. Moreover, the extension of the reflection part 51 as described above avoids the necessity of a strict alignment between the reflection part 51 and the non-light-emitting region 4B of the planar light-emitting panel 4 when the planar light-emitting panel 4 is disposed on the translucent material 5, leading to an improvement of a yield.

Figure 5A:
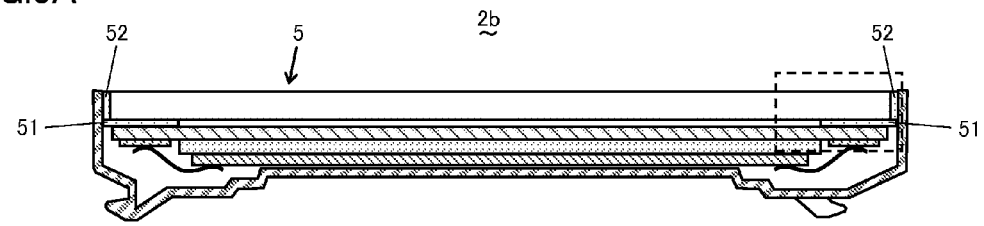
FIG. 5A is a cross-sectional view of a light source unit which makes up a lighting device according to a modification example of the first preferred embodiment.
Figure 5B:
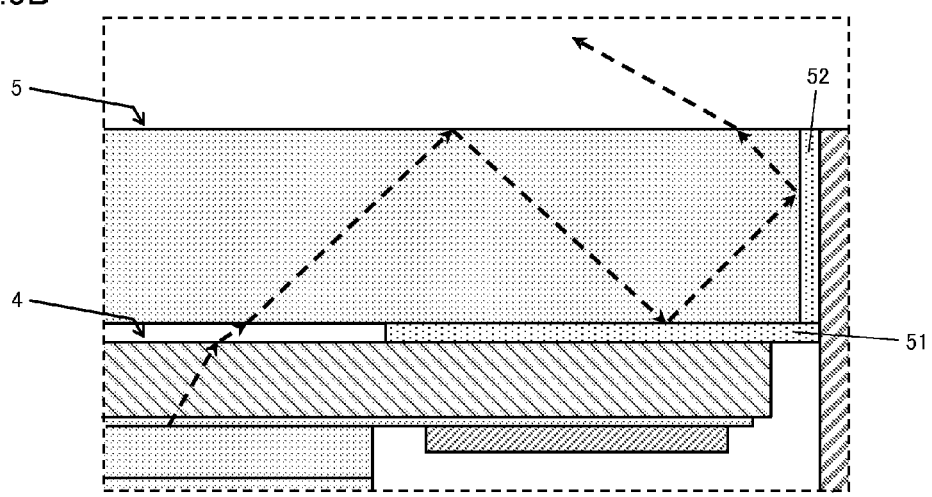
FIG. 5B is an enlarged view of a region enclosed by a dashed line in FIG. 5A.

Next, a light source unit which makes up a lighting device according to a modification example of the above preferred embodiment is described with reference to FIGS. 5A and 5B. In a light source unit 2b which is developed on the basis of the above light source unit 2, a side reflection part 52 is provided at a side surface of the translucent material 5 to reflect and diffuse light. The side reflection part 52 is formed by applying the white coating material or sticking the white tape in the same manner with the reflection part 51. By providing such a side reflection part 52, the light laterally guided into the translucent material 5 (shown by dashed line in FIG. 5B) is reflected and diffused by the side reflection part 52 and then emitted from the device, resulting in an enhancement of irradiation light luminance at a periphery of the translucent material 5.

Figure 6:
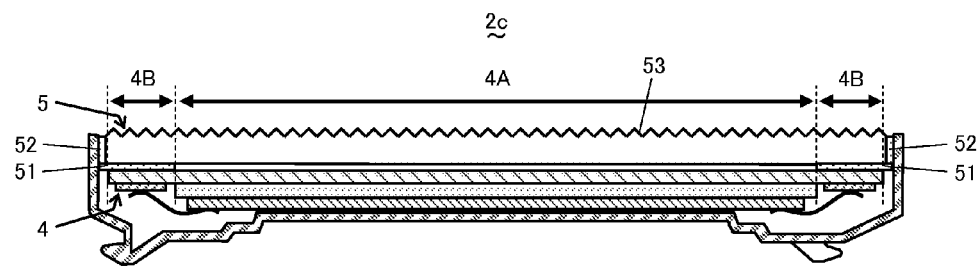
FIG. 6 is a cross-sectional view of a light source unit which makes up a lighting device according to another modification example of the first preferred embodiment.

Next, a light source unit which makes up a lighting device according to another modification example of the above preferred embodiment is described with reference to FIG. 6. In a light source unit 2c which is developed on the basis of the above light source unit 2b, a light outputting surface 53 of the translucent material 5 is prepared as a light diffusion surface which diffuses light. Such a light diffusion surface is obtained, for example, by forming fine projections and depressions through a sandblast or frosting processing of the light outputting surface 53. According to such a processing, since the light emitted from the planar light-emitting panel 4 is diffused in various directions in the translucent material 5 and then emitted outside, the luminance unevenness can be highly reduced. Moreover, since the light guided into the translucent material 5 is diffused and reflected to the inside of the translucent material 5, the light which reaches the reflection part 51 and the side reflection part 52 increases and a boundary between the light-emitting region 4A and the non-light-emitting region 4B becomes inconspicuous.

Figure 7:
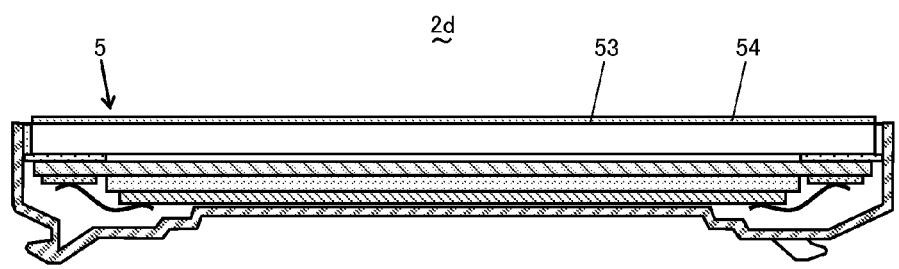
FIG. 7 is a cross-sectional view of a light source unit which makes up a lighting device according to still another modification example of the first preferred embodiment.

Next, a light source unit which makes up a lighting device according to still another modification example of the above preferred embodiment is described with reference to FIG. 7. In a light source unit 2d which is developed on the basis of the above light source unit 2b, a light diffusion layer 54 is further added to the light outputting surface 53 to diffuse the light. The light diffusion layer 54 is formed, for example, by applying a diffusion coating or a light diffusion sheet on the light outputting surface 53. According to the light source unit 2d, the effect similar to that of the above light source unit 2c can be obtained.

Figure 8:
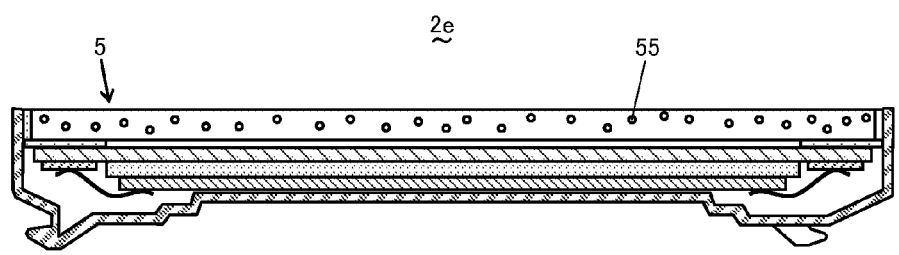
FIG. 8 is a cross-sectional view of a light source unit which makes up a lighting device according to still another modification example of the first preferred embodiment.

Next, a light source unit which makes up a lighting device according to still another modification example of the above preferred embodiment is described with reference to FIG. 8. In a light source unit 2e which is developed on the basis of the above light source unit 2b, a light diffusion agent 55 is contained in the translucent material 5 to diffuse the light. Such a light diffusion agent 55 is made up of, for example, particulate titanium dioxide, particulate silicon dioxide or particulate ceramic. The light diffusion agent 55 diffuses the light and thereby increases the light which is guided through the translucent material 5, so that it is capable of efficiently reducing the luminance unevenness and making a boundary between the light-emitting region 4A and the non-light-emitting region 4B inconspicuous.

Figure 9:
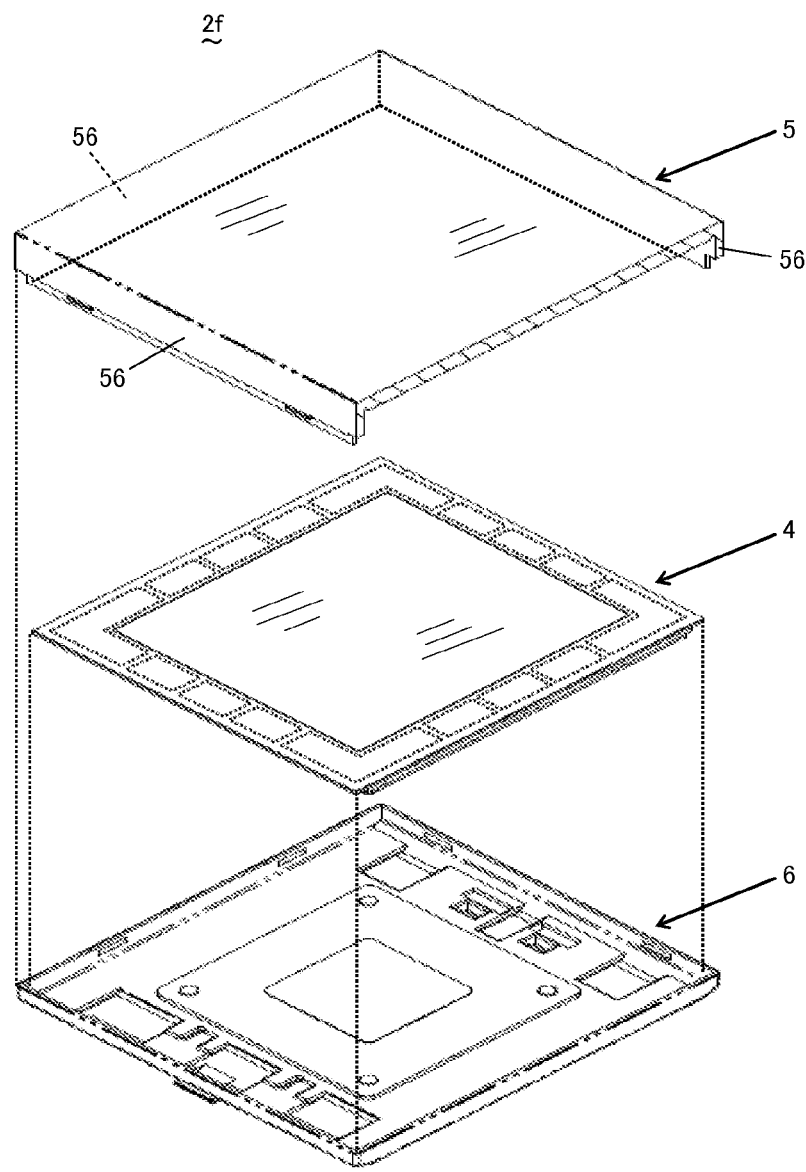
FIG. 9 is an exploded perspective view of a light source unit which makes up a lighting device according to a second preferred embodiment of the present invention.
Figure 10:
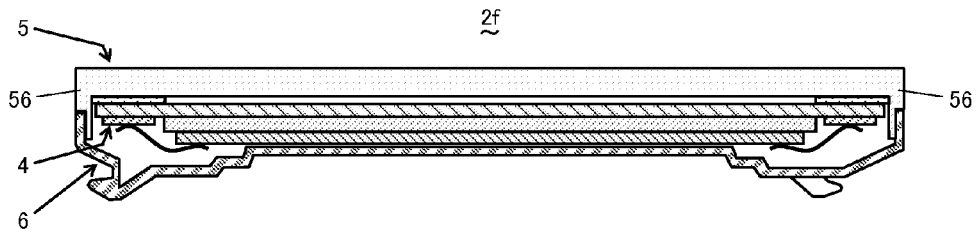
FIG. 10 is a cross-sectional view of the light source unit shown in FIG. 9.

Next, a light source unit which makes up a lighting device according to a second preferred embodiment of the present invention is described with reference to FIGS. 9 and 10. In a light source unit 2f which is developed on the basis of the above light source unit 2, a peripheral frame 56 extends from a periphery of the translucent material 5 so as to cover a side surface of the planar light-emitting panel 4. The peripheral frame 56 is made up of a material which is the same with the translucent material 5 and engages with the upper surface side-edge of the backside case 6. According to such a configuration, since the light emitted from the planar light-emitting panel 4 passes through the peripheral frame 56 and is emitted outside, enabling light irradiation to a lateral side of the light source unit 2f.

Figure 11:
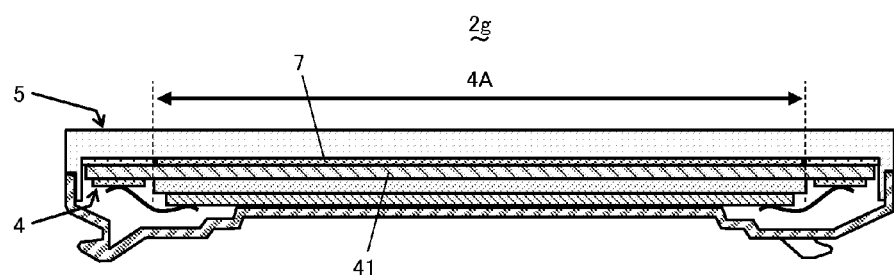
FIG. 11 is a cross-sectional view of a light source unit which makes up a lighting device according to a modification example of the second preferred embodiment.
Figure 12:
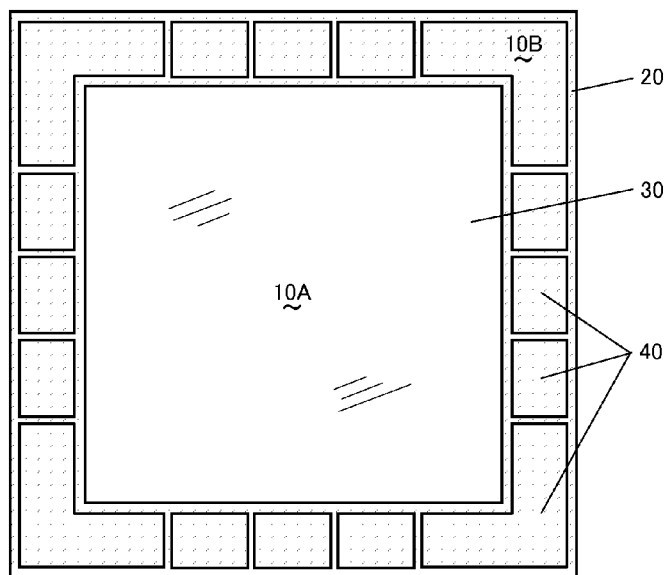
FIG. 12 is a plane view of a general planar light-emitting panel.
Figure 13:
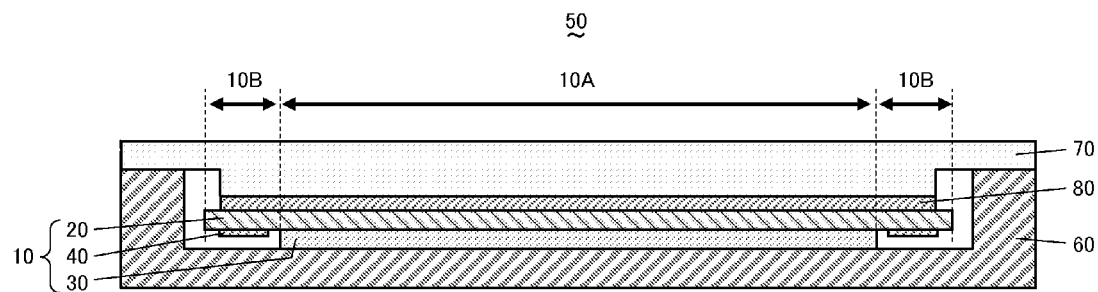
FIG. 13 is a cross-sectional view of a conventional lighting device utilizing the general planar light-emitting panel shown in FIG. 12.

Next, a light source unit which makes up a lighting device according to a modification example of the above preferred embodiment is described with reference to FIG. 11. In a light source unit 2g which is developed on the basis of the above light source unit 2f, the base material 41 (the planar light-emitting panel 4) and the translucent material 5 are adhered or stuck to each other via a translucent resin 7. The translucent resin 7 is made up of, for example, a material having the same reflective index with the material which constitutes the base material 41 or the translucent material 5 or a material having a reflective index intermediate between the materials which constitute the base material 41 and the translucent material 5. According to such a configuration, a total reflection at a boundary between the base material 41 and the translucent resin 7 as well as a boundary between the translucent resin 7 and the translucent material 5 is reduced, enabling to increase light extraction efficiency.

The lighting device according to the present invention is not limited to the above preferred embodiment and its modification example and various modifications are applicable within the scope of the invention. For example, based on the above light source units 2b to 2g, the reflection part can be extended toward a region facing the light-emitting region. Moreover, based on the above light source units 2 to 2f, the planar light-emitting panel and the translucent material can be adhered or stuck to each other via the translucent resin. Furthermore, based on the above light source units 2f and 2g, light diffusion ability can be added to the translucent material.

The invention claimed is:

1. A lighting device, comprising:
a planar light-emitting panel having a light-emitting surface on one side; and
a flat plate-shaped translucent material disposed on the light-emitting surface side of the planar light-emitting panel, wherein
the planar light-emitting panel has a light-emitting region from which light is emitted and a non-light-emitting region located around the light-emitting region from which light is not emitted,
the translucent material has a reflection part which is provided in a region facing the non-light-emitting region and reflects light,
the reflection part is extended toward a region which faces the light-emitting region of the planar light-emitting panel, and
a region surrounded by the reflection part becomes smaller than the light-emitting region.

2. The lighting device according to claim 1, wherein
the reflection part is formed by applying a white coating material or sticking a white tape on the translucent material.

3. The lighting device according to claim 1, wherein
the translucent material further has a side reflection part which is provided at a side surface of the translucent material and reflects light.

4. The lighting device according to claim 1, wherein
a light outputting surface of the translucent material is prepared as a light diffusion surface which diffuses light.

5. The lighting device according to claim 1, wherein
a light diffusion layer which diffuses light is further added onto a light outputting surface of the translucent material.

6. The lighting device according to claim 1, wherein
the translucent material contains a light diffusion agent which diffuses light.

7. The lighting device according to claim 1, wherein
the translucent material and the planar light-emitting panel are adhered or stuck to each other via a translucent resin.

8. The lighting device according to claim 1, wherein
the translucent material further has a peripheral frame which extends from a periphery of the translucent material so as to cover a side surface of the planar light-emitting panel.

* * * * *